United States Patent [19]

Lindbery et al.

[11] Patent Number: 5,258,902

[45] Date of Patent: Nov. 2, 1993

[54] SNUBBER CIRCUIT LOCATED BETWEEN AN OUTPUT LINE AND LOW IMPEDANCE POTENTIAL

[75] Inventors: John R. Lindbery; David F. Flanagan, both of Santa Barbara, Calif.

[73] Assignee: Simmonds Precision Products, Inc., Akron, Ohio

[21] Appl. No.: 882,191

[22] Filed: May 11, 1992

[51] Int. Cl.$^5$ .......................................... H02H 7/122
[52] U.S. Cl. ........................................ 363/56; 363/132
[58] Field of Search .................... 363/17, 55, 56, 58, 363/95, 96, 98, 132

[56] References Cited

U.S. PATENT DOCUMENTS

| | | | |
|---|---|---|---|
| 4,231,083 | 10/1980 | Matsuda et al. | 363/96 |
| 4,691,270 | 9/1987 | Pruitt | 363/132 |
| 4,805,081 | 2/1989 | Chambers et al. | 363/96 |
| 4,853,836 | 8/1989 | Furuhashi | 363/58 |
| 4,922,401 | 5/1990 | Lipman | 363/96 |
| 4,926,306 | 5/1990 | Ueda et al. | 363/58 |
| 5,075,838 | 12/1991 | Schnetzka et al. | 363/56 |

OTHER PUBLICATIONS

Steyn, C. G., "Optimum Size of Dissipative Nonlinear Turn-Off Snubber", IEE Proceedings, vol. 135, Pt. B, No. 4, Jul. 1988, pp. 165-171.

Evans et al., "Analysis of Conventional Snubber Circuits for PWM Inverters Using Bipolar Transistors", IEE proceedings, vol. 135, Pt. B, No. 4; Jul. 1988, pp. 180-192.

McMurray, "Optimum Snubbers for Power Semiconductors", IEEE Transactions on Industry Applications, Sep./Oct. 1972, pp. 593-600.

Doncker et al., "The Auxiliary Resonant Commutated Pole Converter", IEEE, 1990, pp. 1228-1235.

Doncker, "Resonant Pole Converters", GE-CRD, PESC-91, Boston, Mass., pp. 1-41.

Primary Examiner—J. L. Sterrett
Attorney, Agent, or Firm—William E. Zitelli; Mark D. Saralino

[57] ABSTRACT

A dual snubber circuit for a switching circuit including first snubber means for performing a first snubbering function in a switching operation of the switching circuit, and second snubber means for performing a second snubbering function in the switching operation of the switching circuit, the first and second snubber means performing the first and second snubbering functions substantially independently.

26 Claims, 3 Drawing Sheets

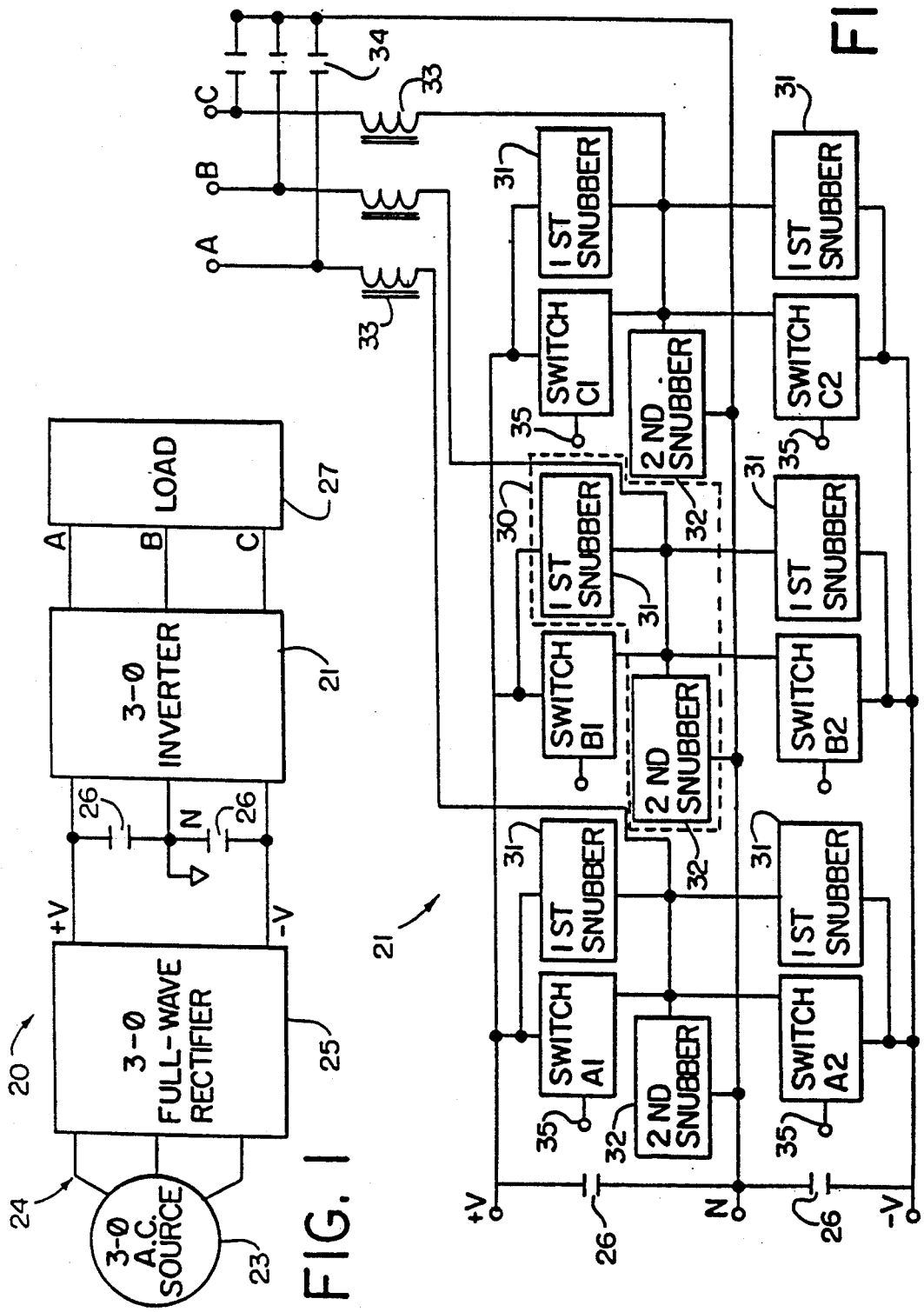

SNUBBER CIRCUIT LOCATED BETWEEN AN OUTPUT LINE AND LOW IMPEDANCE POTENTIAL

TECHNICAL FIELD OF THE INVENTION

The present invention relates generally to snubber circuits and, more particularly, to a dual snubber circuit. Even more particularly, the present invention relates to a dual snubber circuit which can be used in a switching inverter.

BACKGROUND OF THE INVENTION

Snubber circuits are known in the art. Snubber circuits generally are used with switching devices such as power semiconductors. The snubber circuit is designed to provide efficient and reliable operation in a switching circuit by performing one or more different snubbering functions. For example, the snubber circuit suppresses the voltage spikes that are generated across a switch as a result of the switching off of the electrical current as in a switching inverter or chopper circuit having an inductive filter circuit at the output thereof. In particular, the snubber circuit prevents the development of excessive transient voltage peaks across the switching device upon the opening of the switching device and the resultant interruption of current flow through the inductive element of the output filter. The snubber circuit thereby prevents damage to the switching device which otherwise may occur when the transient voltage peaks exceed the rated voltage limits of the switching device.

Snubber circuits also are useful to tailor switching trajectory, reduce switching losses, control the effects of parasitic elements in the circuit, etc. A description of conventional snubber circuits can be found in the following articles: Evans, et al., *Analysis of Conventional Snubber Circuits for PWM Inverters Using Bipolar Transistors*, IEE Proc., Vol. 135, Pt. B, No. 4, pp. 180-192 (July 1988); McMurray, *Optimum Snubbers for Power Semiconductors*, IEEE Trans. on Ind. App. (Sept./Oct. 1972); and Steyn, *Optimum Size of Dissipative Nonlinear Turn-off*, IEE Proc., Vol. 135, Pt. B, No. 4, pp. 165-171 (July 1988). The entire disclosures of the above articles are incorporated herein by reference.

Typically, switch snubbering in a switching inverter or chopper circuit is accomplished using a single resistor-capacitor (R-C) or R-C-Diode (R-C-D) type snubber circuit per switch. Therefore, in a three-phase full bridge inverter with six power switches, there typically are six snubber circuits, or one snubber circuit per switch. Each snubber circuit, however, is required to perform several functions simultaneously. For example, a conventional snubber circuit in an inverter circuit first must limit the peak voltage developed across the power switch upon the interruption of the current flow. In addition, the same snubber circuit must suppress or control any oscillations developed in the inverter circuitry upon the opening of the power switch, particularly in the case where the inverter output circuitry includes inductive components.

There have been several drawbacks, however, associated with conventional snubber circuits. For instance, if the snubber circuit were to provide the best possible circuit performance with respect to each of its intended functions (e.g., to limit peak voltages and to suppress oscillations), the snubber circuit would require different R-C or R-C-D component values. As a particular example, the optimum value of the resistor R required to control the inductive components in an inverter, and therefore suppress oscillations, is typically lower than the optimum value of the resistor R for suppressing the peak voltage developed across the power switch. Moreover, the same type of statements can be made regarding the capacitor C and diode D components in the snubber circuit.

As a result, it has been necessary in the past to accept a trade off as to the different component values in the snubber circuit in view of its intended functions. Snubber optimization has therefore been basically the determination of the best compromise values for the R-C or R-C-D snubber circuit components. Because such a compromise is required, however, it is unlikely that the snubber circuit will be optimized to perform even one of the desired snubbering functions in particular. As a result of such compromise, there have been high losses associated with conventional snubber circuits. These losses have resulted in larger and more expensive components in the snubber circuit, and lower circuit efficiency. Such losses often result in substantial cooling requirements for the inverter circuit, chopper circuit, etc., and in reduced circuit reliability.

In view of the above-mentioned shortcomings associated with existing snubber circuits, there is a strong need in the art for a snubber circuit which can provide improved and/or optimized snubbering for each respective snubbering function. More particularly, there is a strong need for a snubber circuit which provides not only optimal voltage spike suppression, but which also provides optimal oscillation suppression or control, particularly in an inverter circuit.

Furthermore, there is a strong need in the art for a snubber circuit which reduces the loss associated with a switching circuit, thereby resulting in higher circuit efficiency. Moreover, there is a strong need in the art for a snubber circuit which utilizes smaller, less expensive components as compared to existing snubber circuits.

SUMMARY OF THE INVENTION

According to one aspect of the present invention, a dual snubber circuit for a switching operation is provided which includes first snubber means for performing a first snubbering function in a switching operation of the switching circuit, and second snubber means for performing a second snubbering function in the switching operation of the switching circuit, the first and second snubber means performing the first and second snubbering functions substantially independently.

According to another aspect of the present invention, a dual snubber circuit for a switching circuit is provided which includes first snubber means for performing a first snubbering function, the first snubber means being connected in parallel across a switch of the switching circuit which is coupled between an output line and a voltage line; and second snubber means for performing a second snubbering function, the second snubber means being connected in series with the switch from the output line to another voltage line.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings:

FIG. 1 is a block diagram of an inverter system including a three-phase inverter with dual snubber circuitry in accordance with the present invention;

FIG. 2 is a block diagram of the inverter of FIG. 1 with dual snubber circuitry in accordance with the present invention;

DESCRIPTION OF THE PREFERRED EMBODIMENTS

Figure 4:
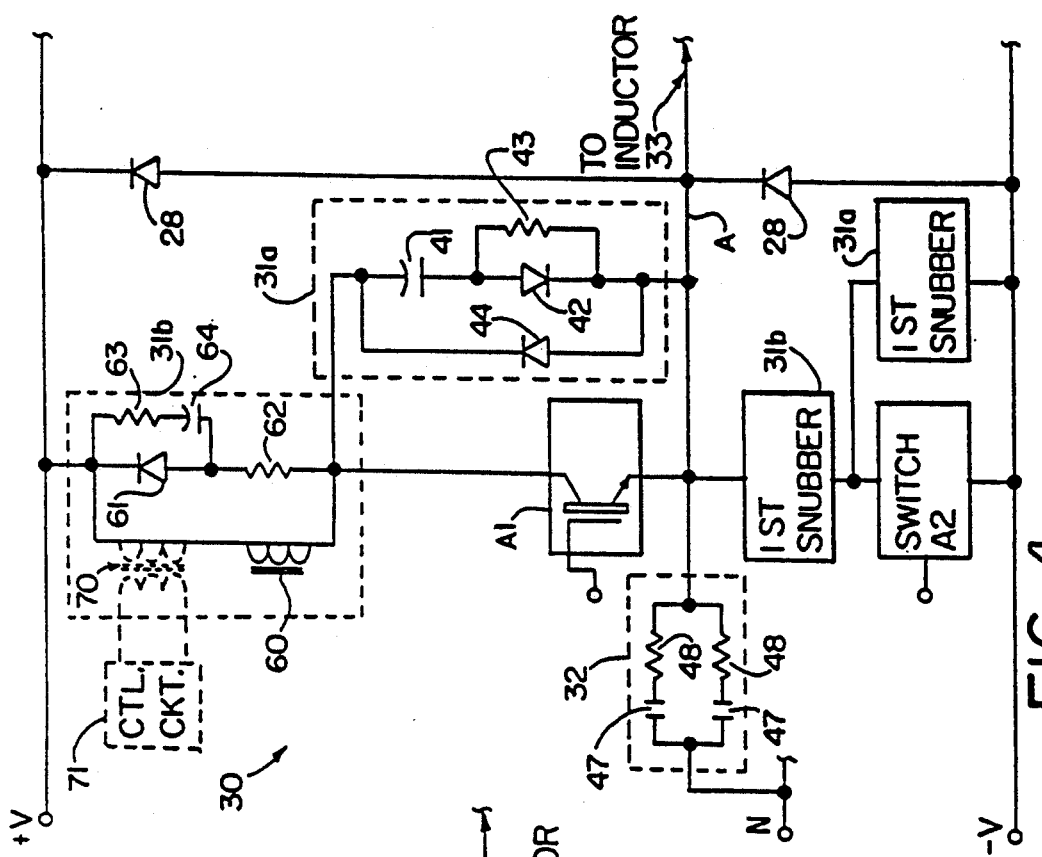
FIG. 4 is a schematic diagram of a dual snubber circuit in accordance with another embodiment of the present invention.

The present invention relates to a dual snubber circuit having two separate snubber circuits. The snubbering functions are substantially divided among the respective snubber circuits. Each snubber circuit handles a separate snubbering function and can be optimized to perform its respective snubbering function substantially independent of the other snubber circuit. The dual snubber circuit of the present invention is particularly suited for use in an inverter and results in lower inverter losses, higher inverter efficiencies, less expensive components, improved circuit reliability and smaller heat dissipation requirements.

The present invention will now be described in detail with reference to the drawings wherein like reference labels are used to refer to like elements throughout. The present invention is described herein as a dual snubber circuit in a switching inverter. It will be appreciated, however, that the dual snubber circuit of the present invention has application in other switching circuits. Other applications will become readily apparent based on the disclosure herein.

Referring initially to FIG. 1, an inverter system 20 having an inverter 21 is shown. The inverter 21 includes a dual snubber circuit (FIG. 2) corresponding to each switch in the inverter. In the exemplary embodiment, the inverter 21 with dual snubber circuitry is a high power static inverter. Such inverter can have an output anywhere in the range of a few milliwatts to many thousands of watts. The inverter system 20 includes a three-phase AC source 23 for providing a three-phase AC output signal on output lines 24. The output lines 24 from the AC source 23 are coupled to a three-phase, full-wave rectifier 25 as is shown.

The rectifier 25 rectifies the output from the AC source 23 and provides a set of DC line voltages $+V$, $-V$ and a neutral (N) to the input of the inverter 21. A pair of DC link capacitors 26 are coupled between the $+V$ and $-V$ lines and the neutral N, and filter line noise from the $+V$ and $-V$ lines. As is conventional, the inverter 21 changes the DC voltages on the $+V$, $-V$ and N lines into a three-phase AC output on output lines A, B and C, respectively. The output of the inverter 21 is delivered to a load 27.

The inverter 21 with dual snubber circuitry 30 is shown in detail in FIG. 2. The inverter 21 in the exemplary embodiment is a full-bridge, three-phase inverter which includes a complementary pair of inverter switches for each phase, namely inverter switches A1 and A2, B1 and B2, and C1 and C2. Each inverter switch has associated therewith a dual snubber circuit 30 for performing at least two different snubbering functions as is described in detail below. Each dual snubber circuit 30 includes a first snubber circuit 31 and a second snubber circuit 32. The first snubber circuit 31 is connected in parallel across the inverter switch. It will be appreciated, however, that the first snubber circuit 31 could be connected in series with the inverter switch in a different embodiment.

The second snubber circuit 32 is connected between the intersection of the inverter switches in each phase and the neutral N as is shown. It will be noted that the inverter switches in each particular phase share a second snubber circuit 32 in common. In another embodiment, however, separate second snubber circuits 32 can be used and are within the intended scope of the present invention. An output filter including a set of output inductors 33 and output capacitors 34 are included at the output of the inverter 21 for filtering the inverter output delivered to the load 27.

The first and second snubber circuits 31 and 32 are each configured to perform a corresponding snubbering function substantially independently of the other snubber circuit. As a result, each snubber circuit can be optimized for its respective function without detrimentally affecting the snubbering performance of the other snubber circuit. Therefore, the dual snubber circuit 30 provides improved snubbering as compared to conventional snubber circuits as will be apparent based on the description provided herein.

Describing briefly the operation of the inverter 21, the upper set of switches A1, B1, and C1 are used to connect selectively the output lines A, B and C, respectively, to the $+V$ line. The lower set of switches A2, B2 and C2 are used to connect selectively the output lines A, B and C, respectively, to the $-V$ line. The state of the individual inverter switches, i.e., whether the inverter switches are "on" or "off", is determined by the gating signal provided to the inverter switches on the corresponding gate lines 35. Thus, when the gating signal provided to the inverter switch A1 is active, the inverter switch A1 will be in an "on" state and the A phase output line will be coupled directly to the $+V$ line. When the gating signal to the inverter switch A1 is inactive, the inverter switch A1 will be turned to an "off" state and the A phase output line will either remain at the neutral N line level or be pulled down to the $-V$ line if the inverter switch A2 is on. In the same manner, the respective states of the remaining inverter switches can be selectively controlled based on the gating signals provided to the respective gate lines 35. Typically, the inverter switches will be driven by an inverter controller (not shown) according to a predetermined pattern. Such a pattern can be, for example, a harmonic elimination pulse width modulation sequence as is known. As a result, an AC signal is produced at the output of the inverter 21.

According to one specific embodiment of the dual snubber circuit 30, the first snubber circuit 31 is configured to limit the peak voltage developed across the inverter switch (i.e., inverter switch A1) upon the interruption of the electrical current flow through the inverter switch. For example, during the time the inverter switch A1 is on, current flows through the inverter switch from the +V line to the load 27 via inductor 33. When the inverter switch A1 is turned off, current through the inductor is abruptly terminated, causing a substantial di/dt induced voltage to be developed across the inverter switch A1 which, in the absence of the first snubber circuit 31, introduces distortion that could otherwise damage the inverter switch as is known.

The second snubber circuit 32 is designed to suppress or otherwise control oscillations developed in the inverter 21 upon the opening of the inverter switch. Such oscillations are likely to occur particularly when the inverter 21 output circuitry includes inductive components such as the output inductors 33. By substantially or completely separating the snubbering functions of limiting voltage spikes and suppressing oscillations between the first and second snubber circuits 31 and 32, respectively, the optimum component values for each snubber circuit can be obtained to perform optimally the corresponding function.

Figure 3:
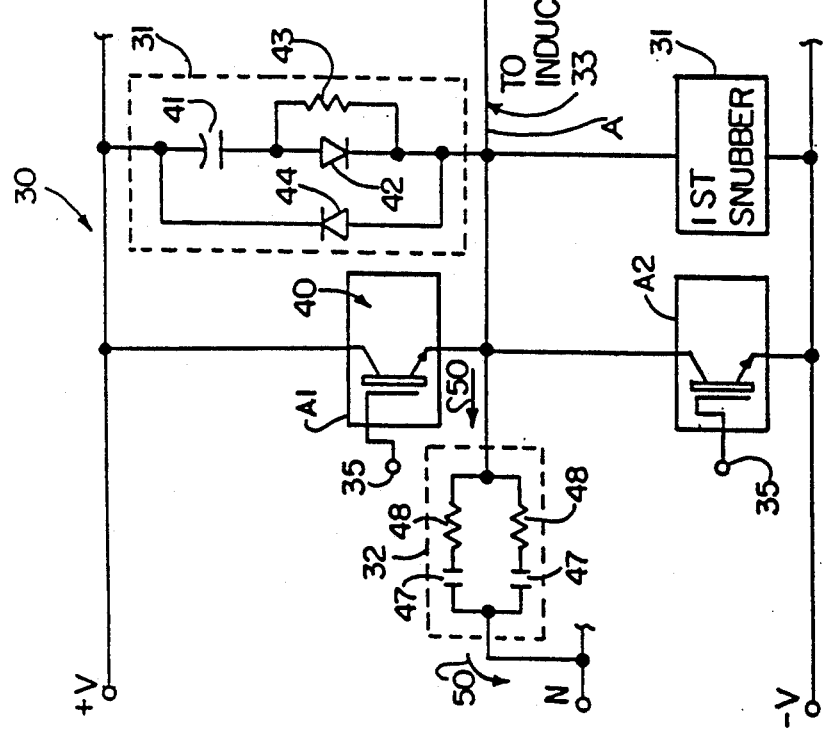
FIG. 3 is a schematic diagram of a dual snubber circuit in accordance with one particular embodiment of the present invention.

Referring now to FIG. 3, the first and second snubber circuits 31 and 32 associated with the inverter switch A1 will be described in detail, although it will be appreciated that the dual snubber circuit 30 associated with each of the other inverter switches will be identical. As is shown in FIG. 3, the inverter switch A1 preferably is an insulated gate power switching transistor 40 with its collector coupled to the +V line and its emitter coupled to the A phase output line. The gating signal is delivered to the insulated base of the transistor 40 to turn the transistor 40 on and off, thus selectively connecting the A phase output line to the +V line.

The first snubber circuit 31 is an R-C-D type snubber circuit having a snubber capacitor 41 connected in series with the parallel combination of a snubber diode 42 and resistor 43. An anti-parallel diode 44 is coupled across the inverter switch A1 in parallel with the snubber capacitor 41, diode 42 and resistor 43 as is shown. The anti-parallel diode 44 may be a discrete component, although it is typically manufactured in the same package as the power transistor 40. The second snubber circuit 32 is an R-C type snubber circuit. In particular, the second snubber circuit 32 includes a parallel combination of two pairs of series connected capacitors 47 and resistors 48, although an equivalent single series capacitor 47 and resistor 48 can be used.

The first snubber circuit 31 in the exemplary embodiment has a conventional snubber circuit topology; however, the first snubber circuit 31 does not require as large a value of capacitor 41 and resistor 43 as are commonly found in conventional snubber circuits used in high power inverters, for example. More particularly, it has been necessary in the past for the conventional snubber circuit to be capable of snubbering, for example, the energy contained in the output inductor 33 of the inverter. The energy stored in the output inductor 33 would in turn be stored on the capacitor 41 as a result of the switch A1 being turned off. The charge on the capacitor 41 then had to be dissipated through the inverter switch A2 when the inverter switch A2 was turned on following the inverter switch A1 turning off. In the event the value of the resistor 43 was too small in the conventional snubber circuit, a large current was forced to flow through the inverter switch A2 from the snubber circuit 31 of the inverter switch A1. This large current was in addition to the current the inverter switch A2 had to handle normally when turned on. The reason the resistor 43 typically had too low a value was because of the above-mentioned compromise in connection with the other functions performed by the conventional snubber circuit.

To overcome such a shortcoming found in conventional snubber circuits, the present invention includes the second snubber circuit 32 between the junction of the inverter switches A1 and A2, the output inductor 33, and a low impedance potential such as the neutral N. The second snubber circuit 32 provides a path 50 through which the output inductor 33 energy on the A phase output line can be conducted to the neutral N or, alternatively, to some other low impedance potential. Since the energy is being coupled directly to the neutral N, very low values for the resistors 48 may be used. Moreover, the component values for the capacitors 47 in the second snubber circuit 32 can be selected to give the optimum damping (i.e., to less than 10% of V) and suppression of the oscillations which would normally occur as a result of the inductive energy of the output inductor 33.

The first snubber circuit 31, as a result, also can use very small values for the respective components. Such component values in the first snubber circuit 31 can be reduced by a factor of 10 to 100 as compared to conventional snubber circuits. The primary reason for such reduction is that the first snubber circuit 31 need only deal with the generally insignificant inductance associated with the conductors about the inverter switch, and the first snubber circuit 31 need not be concerned with the inductance of the output inductor 33. As a result, the first snubber circuit 31 can be optimized to limit the peak voltage across the inverter switch A1 when the inverter switch is turned off. The net result is that the power dissipation in the first and second snubber circuits 31 and 32 of each respective inverter switch is relatively low as compared to conventional R-C or R-C-D type snubber circuits.

Thus, the dual snubber circuit 30 and the inverter system 20 as a whole are more efficient. Moreover, because the dual snubber circuit components dissipate less power than in a conventional snubber circuit, smaller and less expensive components can be used. In addition, because less power is dissipated, there will be lower cooling requirements for the inverter 21.

A particular advantage associated with the use of the second snubber circuit 32, as shown, is that the voltage rating of the snubber capacitor 41 in the first snubber circuit 31 need only be one-half its ordinary value in the absence of the second snubber circuit 32. For example, in the present invention when the inverter switches A1 and A2 are off and on, respectively, the snubber capacitor 41 is connected from the +V line to the neutral N via the second snubber circuit 32. As a result, the snubber capacitor 41 will only see one-half the DC voltage. In a conventional inverter without the second snubber circuit 32, the snubber capacitor 41 would see substantially the entire DC voltage from the +V to −V lines when the inverter switches A1 and A2 are off and on, respectively.

Another advantage of the dual snubber circuit 30 is that a resonant pole topology for the inverter 21 is gained without requiring additional components. More particularly, the inverter 21 uses the output inductor 33 in combination with the capacitors 47 in the second snubber circuit 32 to form a resonant pole. The resonant pole allows for fly back action in the inverter 21 which provides for soft switching as will be appreciated.

Although the first and second snubber circuits 31 and 32 have been described thus far as having an R-C-D and R-C topology, respectively, it will be appreciated that any number of other topologies are possible without departing from the scope of the invention. For example, FIG. 4 illustrates another embodiment of the dual snubber circuit 30 which includes additional snubber circuitry in the first snubber circuit 31 for limiting the instantaneous current through the inverter switches upon being turned on. The embodiment represented in FIG. 4 is substantially identical to the embodiment discussed with respect to FIG. 3 and, therefore, only the differences will be discussed herein.

Referring back to FIG. 3, when the inverter switch A1 turns on, there sometimes will be a large instantaneous current conducted through the switch A1, particularly when switching between very high voltages. Such large current continues in part through the second snubber circuit 32 and in remaining part through the first snubber circuit 31 of the inverter switch A2. This switching current, although typically short in duration (i.e., approximately 2 microseconds), can be very large in magnitude (i.e., as high as 2000 amps). Such current can stress and damage the inverter switches.

In FIG. 4, the first snubber circuit 31 is divided into two snubber portions 31a and 31b. The snubber portion 31a is identical to the first snubber circuit 31 discussed above with respect to FIG. 3. The snubber portion 31b has been added for the purpose of limiting the current through the inverter switch A1 at turn on. The snubber portion 31b is connected in series between the +V line and the parallel combination of the inverter switch A1 and the snubber portion 31a. Included in the snubber portion 31b is the parallel combination of an inductor 60 and a series-connected diode 61 and resistor 62. A series-connected resistor 63 and capacitor 64 are coupled across the diode 61.

The inductor 60 is preselected to have a saturation time preferably on the order of approximately five microseconds. The inductor 60 functions to limit the current flow through the inverter switch A1 to below the load current rating of the inverter switch A1. The inductor 60, however, tends to restrict the anti-parallel diode 44 from achieving optimum performance because any fly back energy has to be fed back through the anti-parallel diode 44 and the inductor 60. To compensate for the effects of the inductor 60, the series-connected diode 61 and resistor 62 are included in the snubber portion 31b to provide a route for returning the fly back energy to the +V line. In addition, diodes 28 have been added between the +V and −V lines and the A phase output line to provide the major conduction path for the energy in the output inductor 33. The magnitude of the inductor 60 need only be large enough to limit the current flow produced by the switching operation at high voltages. The use of a smaller value for the inductor 60 results in reduced power loss in the resistor 62 of the snubber porion 31b. As a result, smaller and less expensive components may be utilized. The value of the resistor 62 is preselected preferably to provide for the substantial discharge for the inductor flyback energy before the next switching transition, as will be appreciated. Moreover, since the values of the inductor 60 and the resistor 62 determine the time constant of the snubber porion 31b, it is preferable that the value of the inductor 60 be as small as possible if the snubber porion 31b is to respond to high frequency signals.

It is noted that the inductor 60 is also operative to limit the current pulse into the switch snubber capacitor 41 associated with the opposite inverter switch (i.e., inverter switch A2). In a conventional snubber circuit, the snubber capacitor is large. With the dual snubber circuit of the present invention, however, a smaller snubber capacitor 41 may be used across the inverter switch. Therefore, the amount of inductance in the inductor 60 can be minimized, resulting in smaller, less expensive, and more efficient parts.

In summary, it will be appreciated that the snubber portion 31b has to handle primarily only the very high frequency components generated in the switching operation rather than the entire fly back current. This results in smaller component values for the snubber portion 31b than would otherwise be required in a conventional R-C or R-C-D type snubber circuit.

Exemplary component values for the dual snubber circuit 30 based on an exemplary 400 amp (250 kilowatts) inverter 21 are included in the following Table:

TABLE

| Component | Value |
| --- | --- |
| C41 | 0.1 microfarad, 1000 volts |
| R43 | 50 ohms, 25 watts |
| C47 | 1.0 microfarad |
| R48 | 0.5 ohm, 70 watts |
| L60 | 12 microhenrys |
| R62 | 0.1 ohm, 70 watts |
| R63 | 1.0 ohm, 5 watts |
| C64 | 0.047 microfarad, 1600 volts |

It will be appreciated based on the disclosure herein that in an alternate embodiment of the dual snubber circuit, a saturable reactor (not shown) can be used in place of the inductor 60. The saturable reactor is preselected so as to saturate after the switching transition is completed and after the switch snubber capacitor 41 in the opposite switch (e.g., switch A2) is charged.

In still another embodiment, the snubber portion 31b includes a current transformer 70 (shown in phantom in FIG. 4) for detecting the current through the inductor 60. The current transformer 70 provides a feedback signal to an inverter control circuit 71 indicating the amount of current flowing through the inductor 60 and the inverter switch A1. In the event there is a short circuit or some other condition that causes a high current through the inverter switch, the current transformer 70 provides the feedback signal to the control circuit 71 which in turn causes the inverter switch to turn off (i.e., via an appropriate gate signal) within a prescribed amount of time. The control circuit 71, by providing the appropriate gating signal to the inverter switch, preferably keeps the respective inverter switch turned off for a preselected duration.

Figure 5:
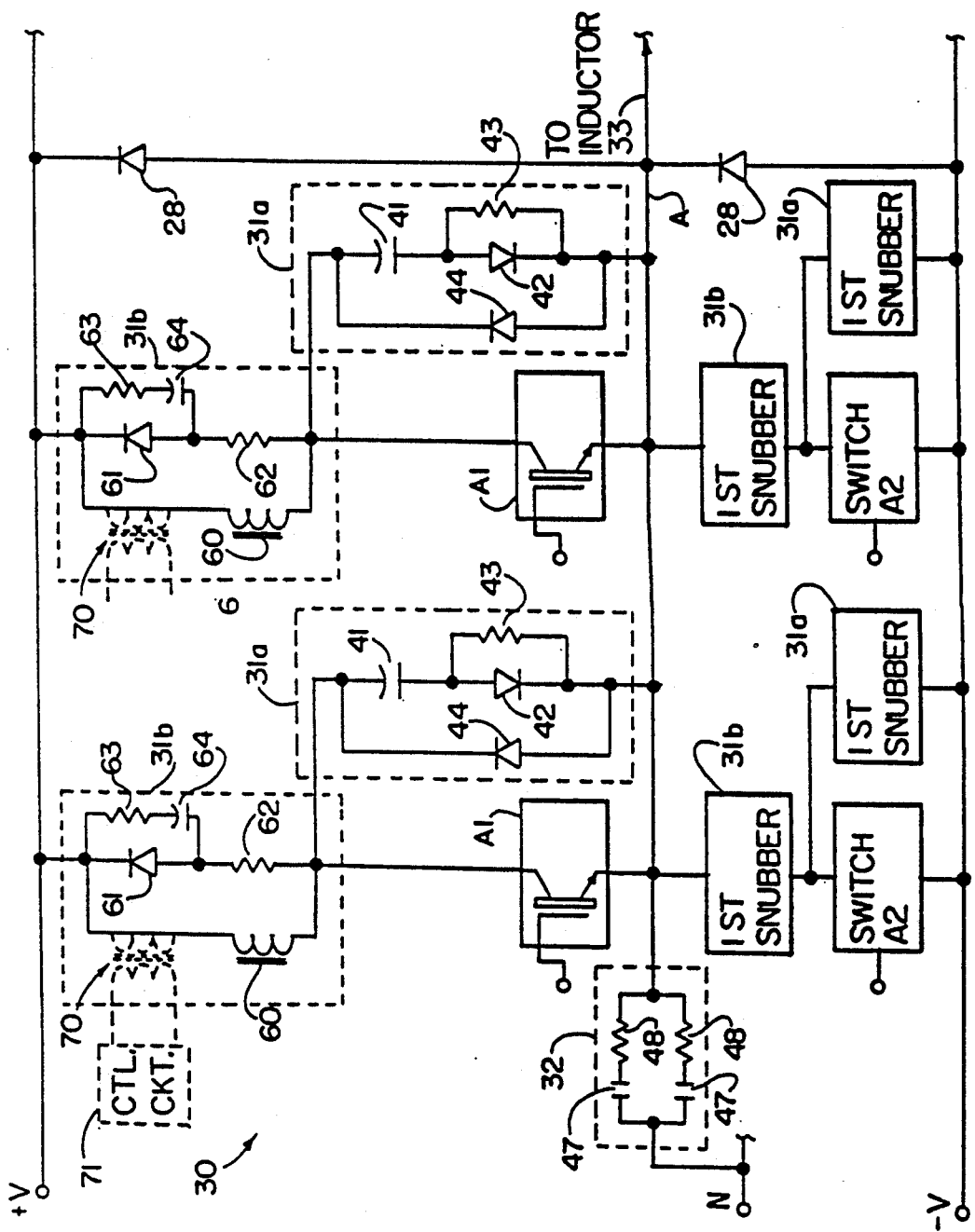
FIG. 5 is a schematic diagram of a dual snubber circuit in accordance with still another embodiment of the present invention.

Referring now to FIG. 5, another embodiment of the dual snubber circuit is shown as used in an inverter or other switching application wherein two or more switches are operated in parallel. For example, the inverter shown in FIG. 5 includes a pair of parallel inverter switches A1 and a pair of parallel inverter switches A2 in the A phase for selectively connecting the A phase output line to the +V and −V lines, respectively. Prefereably, both of the inverter switches in the respective parallel pairs share a common gating signal so as to operate in parallel. The operation of the inverter switches and their corresponding dual snubber circuits is substantially the same as is described above; however, the dual snubber circuit of the present invention provides an additional advantage when operating switches in parallel.

In particular, the inductor 60 in the respective snubber portions 31b provides a means of balancing the switch currents when operating switches in parallel. As will be appreciated, there are two operational conditions in switches where nearly identical switching characteristics must be had if switches are to share current equally when operating in parallel: 1) during the switching transition from "off" to "on" or from "on" to "off"; and 2) during the normally longer "steady state on" condition.

It is difficult to obtain two separate devices that have switching characteristics that are closely identical so as to guarantee equal current sharing. The most difficult conditions to match are the on-off or off-on conditions. The relatively long term "on" conditions of two switches can be easily matched to a sufficient degree by a steady state DC current test, but matching the switching transition characteristics requires dynamic testing of considerable difficulty. The "off" transition may differ from the "on", and these characteristics are not adjustable so they can only be selected by sorting. Those of sufficiently similar characteristics then must still have sufficiently similar steady state "on" conditions before a suitable pair can be obtained. As a result, it has been expensive and difficult in the past to determine a suitable pair of switches to be operated in parallel.

In the present invention, by using the inductor 60 in series with each switch, the rate of change of current $$\left(\frac{di}{dt}\right)$$

can be established that will be sufficiently slower than the actual switching time of the parallel switches so that variation in the switching characteristics are not noticeable in the period of transition from "off" to "on" and vice versa.

The magnitude of the inductor 60 need only be large enough to allow the rate of change of current to swamp out the switch "on-off" characteristics.

Another method of balancing the parallel switch current is to use centertapped inductor or autotransformer (not shown) where the centertap is connected to the positive power source and the ends of the inductor connect to each of two parallel switches. In this configuration, any imbalance in current flow induces a compensating voltage in the opposite side of the inductor, thereby causing the currents to equalize in the switches. Sufficient transition time to cover the switching times is obtained in the same manner as in the separate inductors 60.

Although the invention has been shown and described with respect to certain preferred embodiments, it is apparent that equivalents and modifications will occur to others skilled in the art upon the reading and understanding of the specification. For example, although the invention is described with respect to a full-bridge inverter, the invention can be used in connection with virtually any type of inverter having switches. Moreover, the dual snubber circuit of the present invention has applications in most other fields where switching occurs and is not intended to be limited to use with an inverter. In addition, although certain specific dual snubber circuit topologies have been discussed for the dual snubber circuit, other topologies are equally within the scope of the present invention. Even further, although the respective snubbering functions of the first and second snubber circuits are described primarily with respect to voltage spike suppression and oscillation suppression, respectively, other snubbering functions such as those described above can be implemented according to the present invention. The present invention includes all such equivalents and modifications, and is limited only by the scope of the following claims.

What is claimed is:

1. A dual snubber circuit for a switching circuit in an inverter circuit for inverting DC power provided on a first supply potential and a second supply potential into AC power on an output line, said switching circuit being coupled between at least one of said supply potentials and said output line, said dual snubber circuit comprising:

first snubber means coupled across said switching circuit for performing a first snubbering function in a switching operation of said switching circuit; and second snubber means coupled between said output line and a low impedance potential other than said first and second supply potentials, for performing a second snubbering function in the switching operation of said switching circuit, said second snubbering function comprising suppressing and controlling oscillations resulting from said switching operation.

2. The dual snubber circuit of claim 1, wherein said first snubbering function comprises limiting the peak voltage developed across a switch of said switching circuit in performing said switching operation.

3. The dual snubber circuit of claim 1, said inverter circuit being a three-phase, full-bridge inverter.

4. The dual snubber circuit of claim 1, said inverter circuit being a pulse width modulated inverter circuit.

5. The dual snubber circuit of claim 1, wherein said first snubbering function comprises limiting the peak voltage developed across said switching circuit.

6. The dual snubber circuit of claim 5, wherein each of said first and second snubber means comprises at least one of a resistor-capacitor circuit and a resistor-capacitor-diode circuit.

7. The dual snubber circuit of claim 5, wherein said second snubber means comprises a resistor and a capacitor connected in series.

8. The dual snubber circuit of claim 1, said inverter circuit having a resonant pole topology as a function of said second snubber means and an output inductor included at an output of said inverter circuit.

9. A dual snubber circuit for a switching circuit in an inverter circuit for inverting DC power provided on a first supply potential and a second supply potential into AC power on an output line, said switching circuit being coupled between at least one of said supply potentials and said output line, said dual snubber circuit comprising:

first snubber means coupled across said switching circuit for performing a first snubbering function in a switching operation of said switching circuit;

second snubber means coupled between said output line and a low impedance potential other than said first and second supply potentials, for performing a second snubbering function in the switching operation of said switching circuit; and said first snubber means further comprising means for performing a third snubbering function, said third snubbering function comprising limiting the current in said switching circuit.

10. The dual snubber circuit of claim 9, said means for performing said third snubbering function comprising an inductor connected in series with a switch of said switching circuit.

11. A snubber circuit for a switching circuit in an inverter circuit for inverting DC power provided on a first supply potential and a second supply potential into AC power on an output line, said switching circuit being coupled between at least one of said supply potentials and an output line, said snubber circuit comprising:

a circuit comprising at least one snubber element coupled between said output line and a low impedance potential other than said first and second supply potentials, for performing a snubbering function in a switching operation of said switching circuit, said snubbering function comprising suppressing and controlling oscillations resulting from said switching operation.

12. The snubber circuit of claim 11, wherein said snubber circuit forms a resonant pole including said inverter circuit to effect soft switching during a switching operation of said switching circuit.

13. The snubber circuit of claim 11, further comprising an output inductor in said output line, said output inductor and said snubber element combining to form a resonant pole topology.

14. The snubber circuit of claim 11, wherein the voltage on said low impedance potential is at a level between said first and second supply potentials.

15. A dual snubber circuit for a switching circuit in an inverter circuit for inverting DC power provided on a first supply potential and a second supply potential into AC power on an output line, said dual snubber circuit comprising:

first snubber means for performing a first snubbering function, said first snubber means being coupled across a switch of said switching circuit which is coupled between said output line and at least one of said first and second supply potentials;

second snubber means for performing a second snubbering function, said second snubber means being coupled between said output line and a low impedance potential other than said first and second supply potentials;

wherein said second snubber means forms a resonant pole including said inverter circuit to effect soft switching during a switching operation of said switch; and said first snubber means further comprising means for limiting the current in said dual snubber circuit.

16. A dual snubber circuit for a switching circuit in an inverter circuit for inverting DC power provided on a first supply potential and a second supply potential into AC power on an output line, said dual snubber circuit comprising:

first snubber means for performing a first snubbering function, said first snubber means being coupled across a switch of said switching circuit which is coupled between said output line and at least one of said first and second supply potentials;

second snubber means for performing a second snubbering function comprising suppressing and controlling oscillations resulting from a switching operation of said switch, said second snubber means being coupled between said output line and a low impedance potential other than said first and second supply potentials; and wherein said second snubber means forms a resonant pole including said inverter circuit to effect soft switching during a switching operation of said switch.

17. The dual snubber circuit of claim 16, wherein said first snubbering function comprises limiting the peal voltage developed across said switch.

18. The dual snubber circuit of claim 17, wherein said limiting of the peak voltage occurs upon the interruption of current flow through said switch.

19. The dual snubber circuit of claim 16, wherein the voltage on said low impedance potential is at a level between said first and second supply potentials.

20. The dual snubber circuit of claim 19, wherein said first and second snubber means perform said first and second snubbering functions substantially independently.

21. The dual snubber circuit of claim 16, wherein said inverter circuit has at least two inverter switches connected in parallel, wherein each of said at least two inverter switches includes said first and second snubbering means with substantially similar circuit topologies.

22. The dual snubber circuit of claim 16, wherein each of said first and second snubber means comprises at least one of a resistor-capacitor circuit and a resistor-capacitor-diode circuit.

23. The dual snubber circuit of claim 22, wherein said second snubber means comprises a resistor and a capacitor connected in series.

24. The dual snubber circuit of claim 16, wherein the voltage on said low impedance potential is between said first and second supply potentials.

25. The dual snubber circuit of claim 24, further comprising an output inductor in said output line, said output inductor and said second snubber means combining to form a resonant pole topology.

26. A dual snubber circuit for a switching circuit in an inverter circuit for inverting DC power provided on a first supply potential and a second supply potential into AC power on an output line, said dual snubber circuit comprising:

first snubber means for performing a first snubbering function, said first snubber means being coupled across a switch of said switching circuit which is coupled between said output line and at least one of said first and second supply potentials;

second snubber means for performing a second snubbering function, said second snubber means being coupled between said output line and a low impedance potential other than said first and second supply potentials;

said inverter circuit having at least two inverter switches connected in parallel, each of said at least two inverter switches including said first and second snubbering means with substantially similar circuit topologies;

wherein said second snubber means forms a resonant pole including said inverter circuit to effect soft switching during a switching operation of said switch; and further comprising means for balancing the switch currents through said at least two inverter switches.

* * * * *